(12) United States Patent
Hynecek

(10) Patent No.: US 8,508,638 B2
(45) Date of Patent: Aug. 13, 2013

(54) 3T PIXEL FOR CMOS IMAGE SENSORS WITH LOW RESET NOISE AND LOW DARK CURRENT GENERATION UTILIZING PARAMETRIC RESET

(75) Inventor: Jaroslav Hynecek, Allen, TX (US)

(73) Assignee: Intellectual Ventures II LLC, Wilmington, DE (US)

( * ) Notice: Subject to any disclaimer, the term of this patent is extended or adjusted under 35 U.S.C. 154(b) by 1284 days.

(21) Appl. No.: 11/079,801

(22) Filed: Mar. 14, 2005

(65) Prior Publication Data

US 2006/0203111 A1  Sep. 14, 2006

(51) Int. Cl.
*H04N 3/14* (2006.01)
*H04N 5/335* (2011.01)

(52) U.S. Cl.
USPC ........... 348/308; 348/241; 348/294; 348/302; 257/291; 257/292

(58) Field of Classification Search
USPC ................. 348/241, 294, 302, 308; 257/291, 257/292
See application file for complete search history.

(56) References Cited

U.S. PATENT DOCUMENTS

| 4,803,709 | A | 2/1989 | Kimata | |
|---|---|---|---|---|
| 5,881,184 | A | 3/1999 | Guidash | |
| 6,441,412 | B2 * | 8/2002 | Oh et al. | 257/292 |
| 6,532,040 | B1 * | 3/2003 | Kozlowski et al. | 348/241 |
| 6,697,111 | B1 * | 2/2004 | Kozlowski et al. | 348/302 |
| 6,911,640 | B1 * | 6/2005 | Bencuya et al. | 250/208.1 |
| 2003/0057431 | A1 | 3/2003 | Kozuka et al. | |
| 2006/0243887 | A1 * | 11/2006 | Boemler | 250/208.1 |

FOREIGN PATENT DOCUMENTS

| JP | 09-064332 | 3/1997 |
|---|---|---|
| JP | 11-214738 | 8/1999 |
| JP | 2000165755 | 6/2000 |
| JP | 2001257943 | 8/2001 |
| JP | 2001251555 | 9/2001 |
| JP | 2003032554 | 1/2003 |
| JP | 2004111488 | 4/2004 |
| JP | 2004-312039 | 11/2004 |
| JP | 2005252674 | 8/2005 |
| KR | 20060131265 | 12/2006 |
| KR | 20070035906 | 4/2007 |
| WO | 2005/011260 | 2/2005 |

OTHER PUBLICATIONS

Tian et al., Analysis of Temporal Noise in CMOS Photodiode Active Pixel Sensor, IEEE Journal of Solid-State Circuits, vol. 36, No. 1, Jan. 2001.*
Fossum, E.R., "Active Pixel Sensors: Are CCCD's Dinosaurs?," Proceedings of the SPIE, vol. 1900, Charge-Coupled Devices and Solid State Optical Sensors III, Feb. 2-3, 1993, San Jose, California, pp. 2-14.
Mendis, S., et al., "CMOS Active Pixel Image Sensor," IEEE Transactions on Electron Devices, vol. 41, No. 3, Mar. 1994, pp. 452-453.
Japanese Office Action dated Aug. 12, 2010 (English translation provided).

* cited by examiner

*Primary Examiner* — Antoinette Spinks
(74) *Attorney, Agent, or Firm* — McAndrews, Held & Malloy, Ltd.

(57) ABSTRACT

The present invention describes in detail the solid-state image sensor, specifically the image sensors pixel that has three transistors, high sensitivity, low reset noise, and low dark current. Low reset noise is achieved by parametrically changing the voltage dependent capacitance of the charge detection node in such a manner that during reset the charge detection node capacitance is low while during sensing and integration cycles the charge detection node capacitance is high. This feature thus results in high dynamic range, which is important for sensors using very small pixels. The low dark current generation is achieved by quenching the interface states by placing a p+ implant near the silicon-silicon dioxide interface.

12 Claims, 3 Drawing Sheets

3T PIXEL FOR CMOS IMAGE SENSORS WITH LOW RESET NOISE AND LOW DARK CURRENT GENERATION UTILIZING PARAMETRIC RESET

FIELD OF THE INVENTION

The invention relates to solid-state image sensors, and more particularly to CMOS image sensors that have Three Transistor pixels (3 T), low dark current, and low reset noise.

BACKGROUND OF THE INVENTION

A typical image sensor senses light by converting impinging photons into electrons that are integrated (collected) in sensor pixels. After completion of integration cycle, charge is converted into a voltage, which is supplied to the output terminals of the sensor. In CMOS image sensors, the charge to voltage conversion is accomplished directly in the pixels themselves, and the analog pixel voltage is transferred to the output terminals through various pixel addressing and scanning schemes. The analog signal can be also converted on-chip to a digital equivalent before reaching the chip output. The pixels have incorporated in them a buffer amplifier, typically the source follower, which drives the sense lines that are connected to the pixels by suitable addressing transistors. After charge to voltage conversion is completed, and the resulting signal transferred out from the pixels, the pixels are reset in order to be ready for accumulation of new charge. In pixels that are using Floating Diffusion (FD) as the charge detection node, the reset is accomplished by turning on a reset transistor that momentarily conductively connects the FD node to a voltage reference. This step removes collected charge, however, it generates kTC-reset noise as is well known in the art. kTC noise has to be removed from the signal by a complicated Correlated Double Sampling (CDS) signal processing technique in order to achieve a desired low noise performance. The typical CMOS sensors that utilize the CDS concept need to have four transistors (4 T) in each pixel while the sensors without the CDS implementation need only 3 T. An example of the 4 T pixel circuit can be found in the U.S. Pat. No. 5,991,184 to Guidash. The description of the 3 T pixel concept can be found, for example, in: Fossum, E. R., "Active Pixel Sensors: Are CCD's Dinosaurs?," Proceedings of the SPIE, vol. 1900, Charge-Coupled Devices and Solid State Optical Sensors III, Feb. 2-3, 1993, San Jose, Calif., pp. 2-14, and in Mendis, S., et al., "CMOS Active Pixel Image Sensor," IEEE Transactions on Electron Devices, vol. 41, No. 3, March 1994, pp. 452-453.

The larger number of transistors in each pixel becomes a problem when the pixel size needs to be reduced in order to build low cost and high-resolution image sensors.

The disclosed invention addresses these difficulties and provides a simpler and practical solution for the 3 T pixel, which can be used in high-resolution compact size image sensors while having lower reset noise. By reducing the detection node capacitance during the reset cycle, the reset noise is also reduced. This is accomplished by forming a "parametric circuit" where the node capacitance depends on the node bias. The described circuit also maintains low dark current by using a shallow p-type implant placed close to the silicon-silicon dioxide interface to quench the interface states.

SUMMARY OF THE INVENTION

Low reset noise is achieved by parametrically changing the voltage dependent capacitance of the charge detection node in such a manner that, during the reset cycle, the detection node capacitance is low, while during the charge sensing and integration cycles, the detection node capacitance is high. This feature thus results in high dynamic range, which is important for sensors using very small pixels. The low dark current generation is achieved by quenching the interface states by placing a p+ implant near the silicon-silicon dioxide interface.

It is an object of the present invention to overcome limitations in prior art. It is further object of the disclosed invention to provide a practical, CMOS image sensor with 3 T image-sensing pixel that has high performance, simple structure, compact size, and low kTC-reset noise. By incorporating a voltage dependent "parametric" capacitor component into the detection node achieves this goal and other objects of the invention.

DESCRIPTION OF A PREFERRED EMBODIMENT

Figure 1:
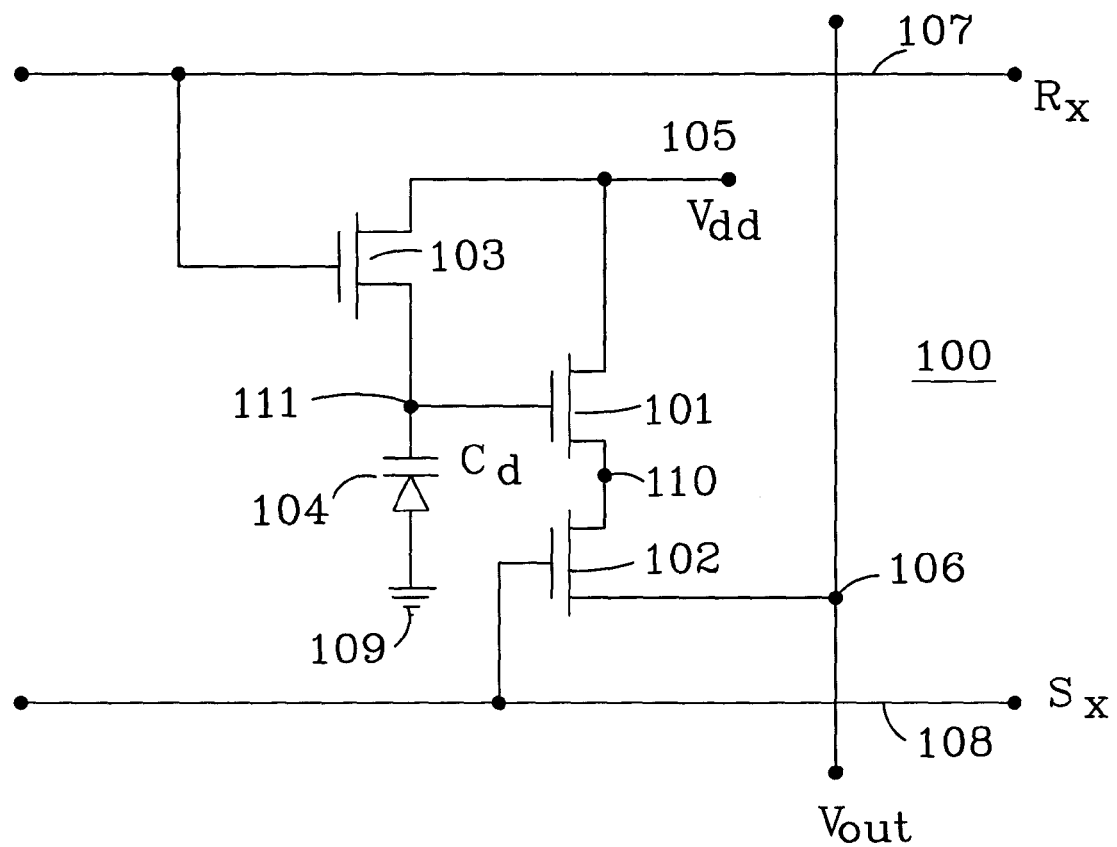
FIG. 1 shows the simplified circuit diagram of a standard, prior art 3 T image sensor pixel that exhibits large kTC reset noise.

In FIG. 1, the drawing 100 represents the simplified circuit diagram of the prior art 3T pixel used in typical CMOS image sensors. Transistor 101 has its drain connected to node 105, which is biased at the level Vdd. The gate of this transistor is connected to charge detection node 111. The source of transistor 101 is connected to node 110, which is also connected to the drain of addressing transistor 102. The source of addressing transistor 102 is connected to vertical column output bus 106. The gate of 102 is connected to horizontal addressing bus 108. The capacitance Cd of charge detection node 111 is represented in this drawing by a fixed value capacitor 104. When charge, generated by impinging light, accumulates in the capacitor Cd the voltage bias of detection node 111 is lowered. This change is sensed by the source follower transistor 101 and is transferred through the addressing transistor 102, when this transistor is turned on, to signal processing circuits that further process the signal. After sensing is completed, charge detection node 111 needs to be reset. This is accomplished by momentarily turning on reset transistor 103 through the signal applied to bus 107 that is connected to its gate. The ground bias is supplied to this circuit through terminal 109.

While this circuit is simple and works well it has a major disadvantage of large kTC noise. When the detection node is reset, charge that is left on the node exhibits fluctuations equal to the square root of kTC. This is where this noise obtained its name. In order to integrate and store large amount of charge in the pixel, to have high Dynamic Range (DR), the detection node capacitance Cd needs to be large. Unfortunately, this also produces large kTC noise. To minimize this problem, many circuits and schemes of kTC noise suppression have been devised in the past and are being used. However, all require more transistors in the pixel and more complicated signal processing circuits with a complicated timing to operate them. This consumes larger pixel area, which presents a limitation for the pixel size reduction, and the complicated circuits consume more power.

Figure 2:
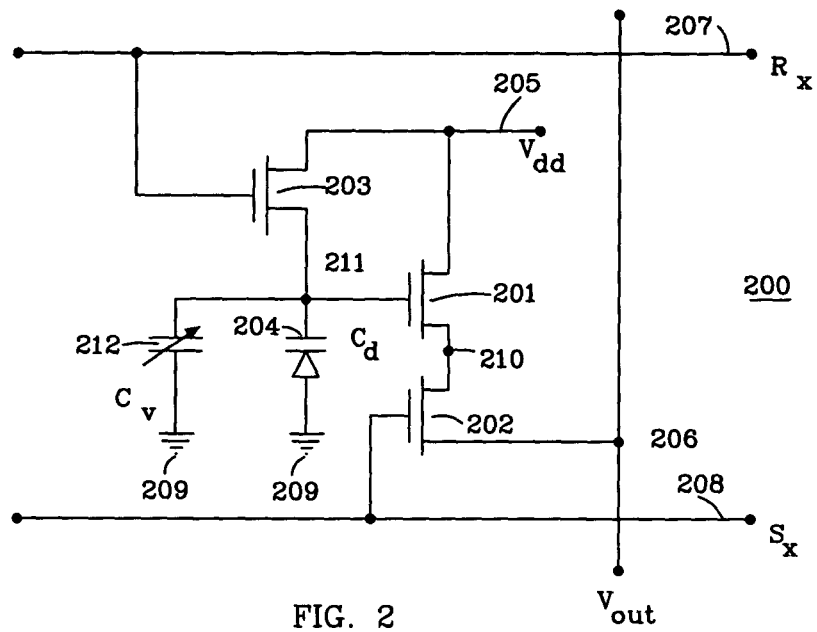
FIG. 2 shows the simplified circuit diagram of the device of disclosed invention that has reduced kTC reset noise.

In FIG. 2, the drawing 200 represents the simplified circuit diagram of the new 3 T pixel that can be used in many standard CMOS image sensors where the prior art pixel is being used. The circuit diagram is almost identical to the prior art circuit with the only one major difference being the addition of a new voltage dependent capacitor Cv, 212. This capacitor is connected in parallel to detection node 211. The components from 101 through 111 in FIG. 1 have their identical counterparts in the circuit components 201 through 211 in FIG. 2.

In FIG. 2, the drawing 200 represents the simplified circuit diagram of the new 3T pixel. Transistor 201 has its drain connected to node, which is biased at the level Vdd. The gate of this transistor is connected to charge detection node 211. The source of transistor 201 is connected to node 210, which is also connected to the drain of addressing transistor 202. The source of addressing transistor 202 is connected to vertical column output bus 206. The gate of 202 is connected to horizontal addressing bus 208. The capacitance Cd of charge detection node 211 is represented in this drawing by a fixed value capacitor 204. When charge, generated by impinging light, accumulates in the capacitor Cd the voltage bias of detection node 211 is lowered. This change is sensed by the source follower transistor 201 and is transferred through the addressing transistor 202, when this transistor is turned on, to signal processing circuits that further process the signal. After sensing is completed, charge detection node 211 needs to be reset. This is accomplished by momentarily turning on reset transistor 203 through the signal applied to bus 207 that is connected to its gate. The ground bias is supplied to this circuit through terminals 209.

The operation and function of the new circuit, however, is significantly different form the operation of the prior art circuit. This can be best understood from the timing diagram 300 shown in FIG. 3.

Figure 3:
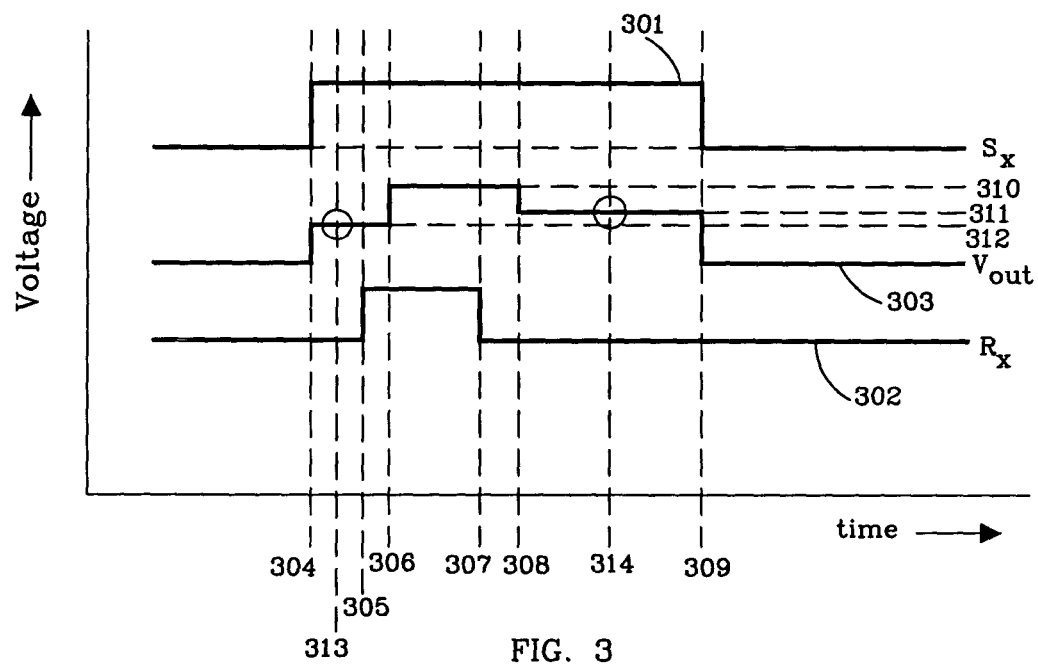
FIG. 3 represents the simplified timing diagram that explains the circuit operation in more detail.
Figure 4:
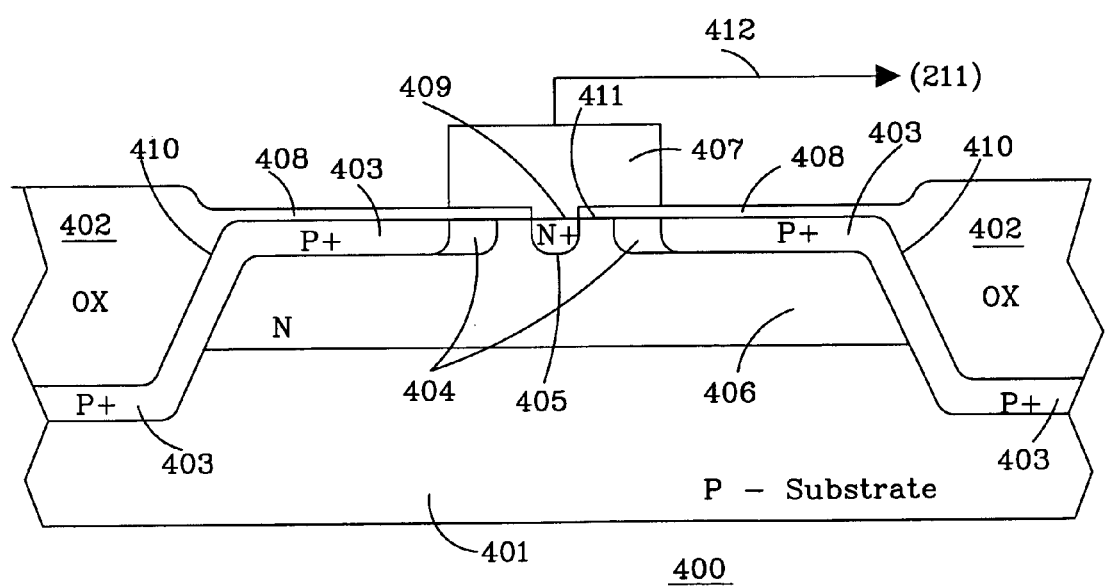
FIG. 4 is the simplified cross section of the pixel photo diode region that has incorporated the "parametric component", the voltage dependent capacitance, and exhibits also a low dark current.

In FIG. 3, pulse 301 represents the addressing pulse, which selects the appropriate image sensor line of the array. This action connects the output of the source follower transistor from a particular pixel to the column bus and supplies the sensed signal from that pixel to signal processing circuits that are located at the periphery of the array. The pixel output signal level, at this time interval, is indicated in the drawing 300 by level 312. This level is sensed by the signal processing circuits at time 313 and stored for further processing. After this time interval is completed reset pulse 302 is applied to reset bus 207 to remove accumulated charge from the node. However, to make sure that the source follower transistor is completely off, and no charge remains in its channel, output line 206 is forced high (waveform 303, level 310) by the external circuit at time 306. Since the "parametric component", capacitor 212, has its capacitance dependent on voltage, its threshold for capacitance There are many ways how a suitable "parametric component" can be incorporated into the circuit. For more clarity one possible embodiment is illustrated in FIG. 4. This figure represents a simplified cross section 400 through the photodiode area as implemented in a Shallow Trench Isolation (STI) CMOS technology. P-type substrate 401 has isolation trenches 410 etched in it and filled with isolation oxide 402. Thin gate oxide 408 is grown on top of the silicon and poly-silicon gate region 407 is deposited and etched on top of the oxide. The thin gate oxide has opening 409 etched in it prior to poly deposition so as to provide a contact for the poly-silicon to silicon. Other means to form the contact are possible and are well known to those skilled in the art. For example, an opening can be etched in the poly, followed by etching the oxide and metal deposited over the opening that connects the poly to silicon can be used. In this embodiment, however, the poly will not be etched and its n+ type doping impurities will be allowed to diffuse into the silicon and form shallow n+ type junction 405 under the poly. Additional n+ implant followed by an appropriate anneal is also possible to be placed into the opening prior to poly deposition. This n+ junction forms the FD detection node capacitance that can be very small. Poly-silicon region 407 and the FD is connected to the gate of transistor 201 (FIG. 2) via interconnect 412. Interconnect 412 can also be formed by continuation of poly silicon itself, and be contiguous with the gate of transistor 201. Junction 405 connects to the low concentration n-type layer 406 that is fully depleted and does not store any charge. The photo-generated charge, created in the p-type substrate and in the n-layer, always drifts into the n+ diffusion and is stored there and in the Cv capacitor (FIG. 2). The Cv capacitor is formed by poly-silicon region 407 and by p– type doped regions 404. The dose of the p– type regions 404 is adjusted such that at the time of reset all holes from region 404 are depleted away. This reduces the Cv capacitance to its minimum at the time of reset. Another p+ type doping 403 is placed at the remaining opened silicon surface and under the isolation oxide in STI regions to minimize the dark current generation. The surface states are thus pinned in these regions, which prevents the dark current generation. The only unpinned region is region 411, but this region is very small causing only a negligible contribution to the dark current. There are no obstructions on the top of the photodiode other than poly-silicon region 407, which can be very small. This feature thus significantly contributes to the pixel high quantum efficiency and sensitivity.

Having described preferred embodiments of the novel 3 T pixel with reduced kTC noise generation that is compact, has high sensitivity, and low dark current, which are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by appended claims.

Having thus described the invention with the details and particularly required by the patent laws, what is claimed and desired protected by Letters Patent is set forth in the appended claims.

What is claimed is:
1. An image sensor pixel circuit, comprising:
a photodiode including a charge detection node configured to convert impinging photons into electrons and to provide a large detection node capacitance during sensing of the charge detection node and a low detection node capacitance during reset of the charge detection node;
a source follower transistor coupled to the charge detection node and configured to sense collected charge; and
a reset transistor coupled to the charge detection node and configured to selectively reset the charge detection node;
wherein the charge detection node is implemented in STI CMOS technology and comprises a p-type implant layer and an n-type doped poly-silicon layer deposited over a portion of the p-type implant layer to form a direct poly-silicon to silicon contact.

2. The circuit of claim 1, wherein the p-type implant layer placed under at least a portion of the n-type doped poly-silicon layer is configured to become fully depleted during reset.

3. The circuit of claim 1, wherein the charge detection node further comprises a p+ doped layer formed along a silicon surface of the charge detection node that is not covered by the n-type doped poly-silicon layer.

4. The circuit of claim 1, wherein the source follower transistor is configured to be biased during reset to permit only a minimum charge amount to be stored in its channel.

5. The circuit of claim 2, wherein the p-type implant layer is configured to not be depleted during sensing and charge-integration cycles.

6. The circuit of claim 1, further comprising an addressing transistor coupled to the source follower transistor and a pixel output, wherein the addressing transistor is configured to selectively couple the charge detection node to the pixel output via the source follower transistor in response to an addressing signal.

7. An image sensor pixel circuit, comprising:
   a photodiode including a charge detection node configured to convert impinging photons into electrons;
   an addressing transistor configured to selectively couple the charge detection node to an output in response to an addressing signal; and
   a reset transistor configured to selectively reset the charge detection node;
   wherein the photodiode and the charge detection node provide a fixed-value capacitor and a voltage-dependent capacitor;
   wherein low reset noise is configured to be achieved by parametrically changing the capacitance of the voltage-dependent capacitor during a reset cycle such that the detection node capacitance is low during a reset cycle and high during charge-sensing and integration cycles; and
   wherein the charge detection node is implemented in STI CMOS technology and comprises a p-type implant layer and an n-type doped poly-silicon layer deposited over a portion of the p-type implant layer to form a direct poly-silicon to silicon contact.

8. The circuit of claim 7, wherein the p-type implant layer placed under at least a portion of the n-type doped poly-silicon layer is configured to become fully depleted during reset.

9. The circuit of claim 7, wherein the charge detection node further comprises a p+ doped layer formed along a silicon surface of the charge detection node that is not covered by the n-type doped poly-silicon layer.

10. The circuit of claim 7, further comprising a source follower transistor coupled to the charge detection node and configured to sense collected charge.

11. The circuit of claim 10, wherein the source follower transistor is configured to be biased during reset to permit only a minimum charge amount to be stored in its channel.

12. The circuit of claim 8, wherein the p-type implant layer is configured to not be depleted during sensing and charge-integration cycles.

* * * * *

UNITED STATES PATENT AND TRADEMARK OFFICE
CERTIFICATE OF CORRECTION

PATENT NO. : 8,508,638 B2  
APPLICATION NO. : 11/079801  
DATED : August 13, 2013  
INVENTOR(S) : Hynecek Page 1 of 1

It is certified that error appears in the above-identified patent and that said Letters Patent is hereby corrected as shown below:

On the Title Page, in Item (56), under "OTHER PUBLICATIONS", in Column 2, Line 4, delete "CCCD's" and insert -- CCD's --, therefor.

In the Specification:

In Column 2, Lines 32-33, delete "DESCRIPTION OF A PREFERRED EMBODIMENT" and insert -- DETAILED DESCRIPTION OF THE PREFERRED EMBODIMENTS --, therefor.

In Column 2, Line 43, delete "102" and insert -- transistor 102 --, therefor.

In Column 3, Line 37, delete "form" and insert -- from --, therefor.

In Column 3, Line 56, delete "for capacitance" and insert -- for capacitance change can be adjusted such that the capacitance is at its minimum when the node is at its reset level. This results in only a very small capacitance being connected to the detection node during the reset and thus in very low kTC reset noise. When transistor 201 is turned back on, at time 307, after completion of reset at time 307, the detection node voltage drops below the Cv "off" threshold level and empty detection node level 311 is sensed at time 314. The voltage difference between the signal levels sensed at times 313 and 314 is then the true pixel output. The address is turned off at time 309, which completes the addressed line signal sensing cycle. --, therefor.

In Column 4, Line 48, delete "particularly" and insert -- particularity --, therefor.

In the Claims:

In Column 4, Line 62, in Claim 1, delete "node;" and insert -- node, --, therefor.

Signed and Sealed this  
Twenty-ninth Day of April, 2014

Michelle K. Lee  
*Deputy Director of the United States Patent and Trademark Office*